US008912600B2

(12) United States Patent
You

(10) Patent No.: US 8,912,600 B2
(45) Date of Patent: Dec. 16, 2014

(54) LATERAL DOUBLE-DIFFUSED METAL OXIDE SEMICONDUCTOR (LDMOS) TRANSISTORS

(75) Inventor: Budong You, Fremont, CA (US)

(73) Assignees: Silergy Technology, Sunnyvale, CA (US); Silergy Semiconductor Technology (Hang-Zhou) Ltd, Hang-Zhou (CN)

( * ) Notice: Subject to any disclaimer, the term of this patent is extended or adjusted under 35 U.S.C. 154(b) by 142 days.

(21) Appl. No.: 13/331,230

(22) Filed: Dec. 20, 2011

(65) Prior Publication Data

US 2012/0091527 A1 Apr. 19, 2012

Related U.S. Application Data

(63) Continuation of application No. 12/288,836, filed on Oct. 23, 2008.

(51) Int. Cl.
| | |
|---|---|
| H01L 29/78 | (2006.01) |
| H01L 29/08 | (2006.01) |
| H01L 29/423 | (2006.01) |
| H01L 29/66 | (2006.01) |
| H01L 29/51 | (2006.01) |

(52) U.S. Cl.
CPC ...... *H01L 29/0878* (2013.01); *H01L 29/42368* (2013.01); *H01L 29/66689* (2013.01); *H01L 29/7816* (2013.01); *H01L 29/086* (2013.01); *H01L 29/512* (2013.01); *H01L 29/517* (2013.01); *H01L 29/518* (2013.01)
USPC .................................. 257/343; 257/E29.256

(58) Field of Classification Search
None
See application file for complete search history.

(56) References Cited

U.S. PATENT DOCUMENTS

| | | | | |
|---|---|---|---|---|
| 5,173,436 A | * | 12/1992 | Gill et al. | 438/262 |
| 5,696,400 A | * | 12/1997 | Yoshida et al. | 257/392 |
| 6,897,525 B1 | * | 5/2005 | Kikuchi et al. | 257/343 |
| 7,405,117 B2 | | 7/2008 | Zuniga et al. | |
| 2001/0035553 A1 | | 11/2001 | Kikuchi et al. | |
| 2005/0106825 A1 | | 5/2005 | You et al. | |
| 2005/0205168 A1 | | 9/2005 | Amano et al. | |
| 2006/0189081 A1 | | 8/2006 | Hsu et al. | |
| 2007/0207600 A1 | | 9/2007 | You et al. | |
| 2010/0301413 A1 | | 12/2010 | You | |

* cited by examiner

*Primary Examiner* — Fernando L Toledo
*Assistant Examiner* — Valerie N Newton
(74) *Attorney, Agent, or Firm* — Michael C. Stephens, Jr.

(57) ABSTRACT

Methods of making, structures, devices, and/or applications for lateral double-diffused metal oxide semiconductor (LDMOS) transistors are disclosed. In one embodiment, an LDMOS transistor can include: (i) an n-doped deep n-well (DNW) region on a substrate; (ii) a gate oxide and a drain oxide between a source region and a drain region of the LDMOS transistor, the gate oxide being adjacent to the source region, the drain oxide being adjacent to the drain region; (iii) a conductive gate over the gate oxide and a portion of the drain oxide; (iv) a p-doped p-body region in the source region; (v) an n-doped drain region in the drain region; (vi) a first n-doped n+ region and a p-doped p+ region adjacent thereto in the p-doped p-body region of the source region; and (vii) a second n-doped n+ region in the drain region.

20 Claims, 13 Drawing Sheets

LATERAL DOUBLE-DIFFUSED METAL OXIDE SEMICONDUCTOR (LDMOS) TRANSISTORS

CROSS REFERENCES TO RELATED APPLICATIONS

This application is a continuation of the following application, U.S. patent application Ser. No. 12/288,836, entitled "LATERAL DOUBLE-DIFFUSED METAL OXIDE SEMICONDUCTOR (LDMOS) TRANSISTORS," filed on Oct. 23, 2008, and which is hereby incorporated by reference as if it is set forth in full in this specification.

FIELD OF THE INVENTION

The present invention generally relates to the field of semiconductor devices. More specifically, embodiments of the present invention pertain to lateral double-diffused metal oxide semiconductor (LDMOS) transistors.

BACKGROUND

Voltage regulators, such as DC-to-DC voltage converters, are used to provide stable voltage sources for various electronic systems. Efficient DC-to-DC converters are particularly needed for battery management in low power devices (e.g., laptop notebooks, cellular phones, etc.). A switching voltage regulator generates an output voltage by converting an input DC voltage into a high frequency voltage, and then filtering the high frequency input voltage to generate the output DC voltage. Specifically, the switching regulator includes a switch for alternately coupling and decoupling an input DC voltage source (e.g., a battery) to a load (e.g., an integrated circuit (IC)). An output filter, typically including an inductor and a capacitor, may be coupled between the input voltage source and the load to filter the output of the switch, and thus provide the output DC voltage. A controller (e.g., a pulse width modulator, a pulse frequency modulator, etc.) can control the switch to maintain a substantially constant output DC voltage.

Lateral double-diffused metal oxide semiconductor (LDMOS) transistors are commonly used in switching regulators due to their performance in terms of a tradeoff between their specific on-resistance ($R_{dson}$) and drain-to-source breakdown voltage ($BV_{d\_s}$). For example, LDMOS transistors may be fabricated using processes, such as a Bipolar-CMOS-DMOS (BCD) process. In one LDMOS transistor approach, two different gate oxide regions can be formed under the transistor gate. One such oxide can be a conventional thin gate oxide, while the other oxide can be a thicker high voltage (HV) gate oxide. However, drawbacks of such an approach may include: (i) a relatively sharp step transitional region between the thin gate oxide and the thick HV oxide, which may be a reliability concern; and/or (ii) negative consequences on field isolation regions resulting from thinning of the field oxide (FOX) when the HV gate oxide is etched back during processing.

SUMMARY

Embodiments of the present invention relate to methods of making, structures, devices, and/or applications for lateral double-diffused metal oxide semiconductor (LDMOS) transistors.

In one embodiment, a method of fabricating an LDMOS transistor with a source region, a drain region, and a gate region on a substrate, can include: (i) implanting n-type dopants into a surface of the substrate to form an n-doped deep n-well (DNW) region; (ii) forming a gate oxide and a drain oxide between the source region and the drain region of the transistor, the gate oxide being adjacent to the source region, the drain oxide being adjacent to the drain region; (iii) forming a gate by covering the gate oxide and a portion of the drain oxide with a conductive material; (iv) implanting p-type dopants into the source region to form a p-doped p-body region; (v) implanting n-type dopants into the drain region to form an n-doped drain region; (vi) implanting n-type dopants into the source region to form a first n-doped n+ region; (vii) implanting n-type dopants into the drain region to form a second n-doped n+ region; and (viii) implanting p-type dopants into the source region to form a p-doped p+ region.

In another embodiment, an n-type LDMOS transistor structure can include: (i) an n-doped DNW region on a substrate; (ii) a gate oxide and a drain oxide between a source region and a drain region of the LDMOS transistor, the gate oxide being adjacent to the source region, the drain oxide being adjacent to the drain region; (iii) a conductive gate over the gate oxide and a portion of the drain oxide; (iv) a p-doped p-body region in the source region; (v) an n-doped drain region in the drain region; (vi) a first n-doped n+ region and a p-doped p+ region adjacent thereto in the p-doped p-body region of the source region; and (vii) a second n-doped n+ region in the drain region.

In another embodiment, a p-type LDMOS transistor structure can include: (i) an n-doped DNW region on a substrate; (ii) a gate oxide and a drain oxide between a source region and a drain region of the LDMOS transistor, the gate oxide being adjacent to the source region, the drain oxide being adjacent to the drain region; (iii) a conductive gate over the gate oxide and a portion of the drain oxide; (iv) an n-doped n-body region in the source region; (v) a p-doped drain region in the drain region; (vi) a first p-doped p+ region and an n-doped n+ region adjacent thereto in the n-doped n-body region of the source region; and (vii) a second p-doped p+ region in the drain region.

Embodiments of the present invention can advantageously provide an LDMOS transistor with good control of a thickness of a drain oxide, and without affecting a field oxide. Further, embodiments of the present invention can allow for the formation of two oppositely doped body regions using a same mask. These and other advantages of the present invention will become readily apparent from the detailed description of preferred embodiments below.

DETAILED DESCRIPTION

Figure 1:
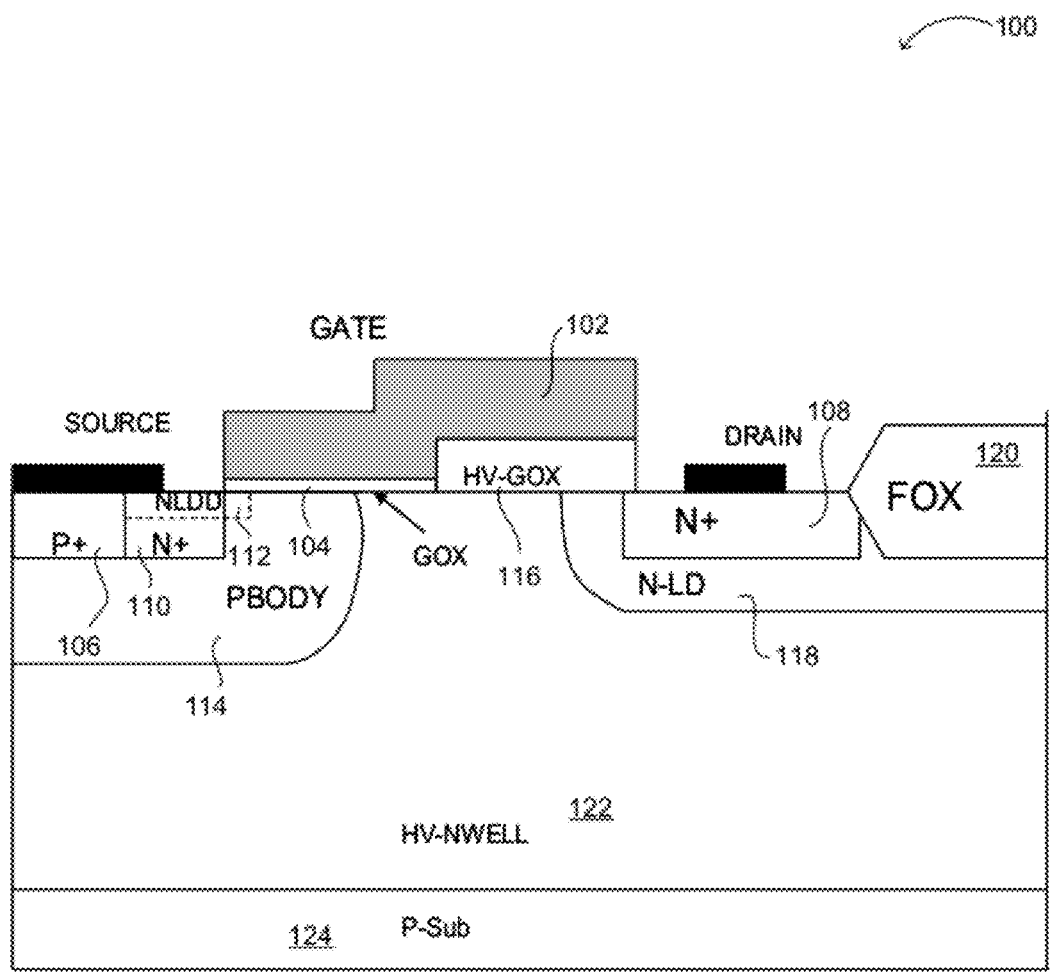
FIG. 1 is a cross-section diagram of an example LDMOS transistor with a step gate oxide.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on code, data bits, data streams, signals, or waveforms within a computer, processor, controller, device and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilising terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

In certain embodiments, a lateral double-diffused metal oxide semiconductor (LDMOS) transistor with a thin gate oxide and a thicker drain oxide can be formed. For example, the drain oxide can be formed using local oxidation of silicon (LOCOS). In addition, an n-doped source link (NSL) region can be formed within the source region. The NSL region can span about a width of a p-doped p-body region, thus allowing use of a same mask during processing. The NSL region may have a lower doping than the source p+ region such that the p-doped p+ region can compensate the NSL n-doped region and form a p-type ohmic contact from the p-body region to the source metal.

The invention further relates to hardware implementations of the present structure, method and circuit. Embodiments of the present invention can advantageously provide an LDMOS transistor with good control of a thickness of a drain oxide, and without affecting a field oxide. Further, embodiments of the present invention can allow for formation of two oppositely doped body regions using a same mask. The invention, in its various aspects, will be explained in greater detail below with regard to exemplary embodiments.

LDMOS transistors are widely used in power device and switching regulator applications. For example, LDMOS transistors may be implemented using a Bipolar-CMOS-DMOS (BCD) process. The BCD process technology enables monolithic integration of CMOS, bipolar, and power devices on the same silicon.

In such a BCD process, an LDMOS transistor may be engineered to have a gate drive voltage and a threshold voltage that are substantially compatible with CMOS logic. In this fashion, the CMOS logic can be configured to directly drive a power LDMOS device or transistor. Such LDMOS transistors may share a CMOS gate oxide (GOX) on the gate-to-source and gate-to-body overlapping regions. For example, a thickness of the GOX may be about 70 Å for a CMOS core being supplied at about 3.3 V, and about 130 Å for a CMOS core supplied at about 5 V. Of course, any suitable GOX thicknesses (e.g., in a range of from about 30 Å to about 400 Å) and CMOS core supplies (e.g., in a range of from about 1.8 V to about 12 V) can be utilised in particular embodiments.

An LDMOS transistor structure having a drain to source operating voltage rating between about 12 V to about 80 V is a focus of BCD technology development due to the relatively wide range of applications. One of the key parameters for a power LDMOS transistor is the specific on-resistance ($R_{dson}$), which is defined as the on-state resistance per unit area of silicon. To achieve a low $R_{dson}$, the cell-pitch of the device may be minimized in order to increase the channel density. For an LDMOS transistor, the drain-to-gate separation region may be relatively large due to the high voltage blocking requirement. Thus, optimization of the drain-to-gate separation structure is a consideration for LDMOS transistor optimization.

Referring now to FIG. 1, shown is a cross-section diagram 100 of an example LDMOS transistor with a step gate oxide. Such an approach may be suitable for an LDMOS transistor with a relatively thin HVGOX. For higher rating LDMOS transistors, the HVGOX thickness may be increased to about 500 Å for a rating of about 20 V, and up to about 1000 Å for a rating of about 40 V. For such a thick (e.g., about 1000 Å) HVGOX, the two-step gate oxide LDMOS structure may be challenging to implement due to: (i) a loss of field oxide (FOX) from the etch-back of HVGOX; and (ii) the relatively sharp step profile at the GOX and HVGOX transitional region.

In the approach of FIG. 1, formation of such a gate oxide structure may be through a two step gate oxide process: (i) first grow the thicker HVGOX and etch-back to define the HVGOX region; and then (ii) uniformly grow the thin gate oxide 104. A drawback of this approach is that silicon regions other than the HVGOX region lose an oxide as thick as the HVGOX during the etch-back process. A p-type p-body (PBODY) region 114 can also be included, with p+ 106 and n+ 110, and n-type lightly doped drain (NLDD) 112 included therewith. On the drain side, an n+ highly doped diffusion region 108 is within a lightly doped n-type diffusion region (N-LD) 118. Also, a p-type substrate 124 can support a high voltage n-type well (HV-NWELL) 122.

Example FOX 120 thicknesses for the CMOS and BCD processes range from about 4000 Å to about 5000 Å. Since the FOX 120 was formed prior to the two-step gate oxide process described above, the FOX will barely grow in thickness during the HVGOX oxidation formation. However, when the HVGOX is etched back, the FOX region loses the same amount of oxide as HVGOX. This thinning of the FOX thickness may have negative unexpected consequences on the field isolation region. Further, the relatively sharp step transitional region between GOX 104 and HVGOX 116 can also be a reliability concern.

Figure 2:
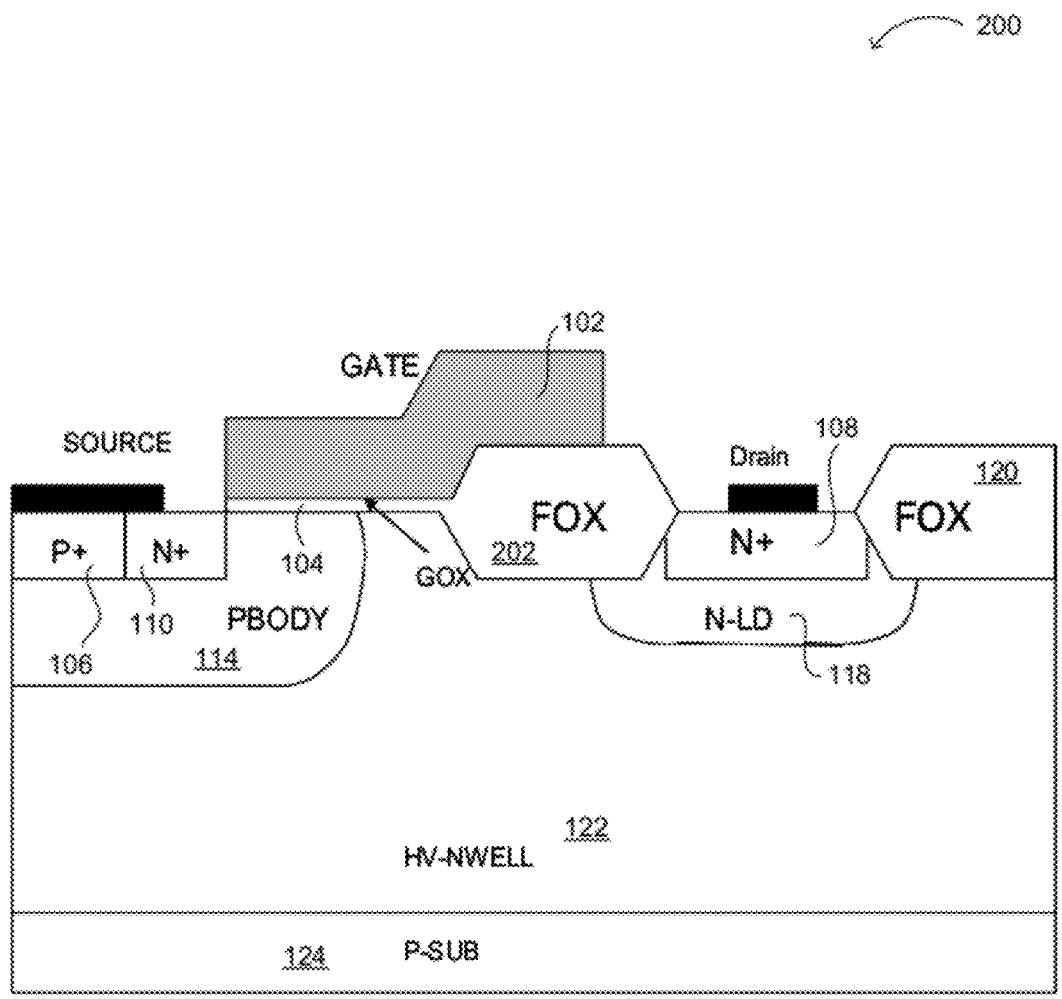
FIG. 2 is a cross-section diagram of an example LDMOS transistor with a field oxide (FOX) as the HV gate oxide.

Referring now to FIG. 2, shown is a cross-section diagram 200 of an example LDMOS transistor with a FOX as the HV gate oxide. In this particular implementation, there may be no FOX thinning issue. However, since the FOX thickness is chosen and optimized for field isolation purposes, this approach may not allow for independent optimization of a FOX thickness for suitable LDMOS $R_{dson}$ performance.

Figure 3:
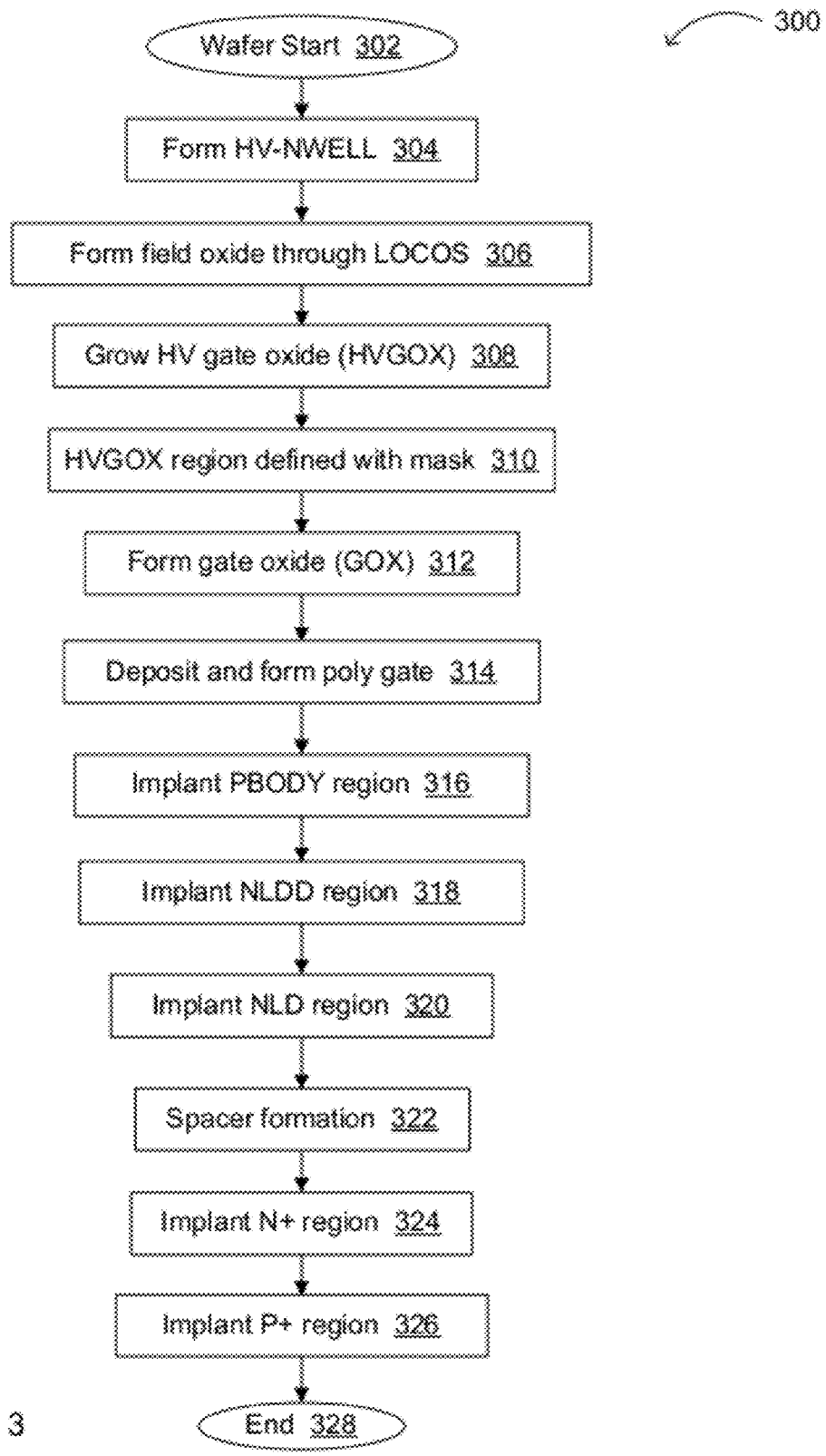
FIG. 3 is a flow diagram of an example method of making the transistor of FIG. 1.

Referring now to FIG. 3, shown is a flow diagram 300 of an example method of making the transistor of FIG. 1. The flow can begin (302), and a high voltage n-well (HV-NWELL) can be formed (304). A field oxide (FOX) region can be formed, such as by using LOCOS (306). An HVGOX layer can then be grown (308), and then patterned using a mask (310). A gate oxide (GOX) can then be formed (312). A polysilicon gate can be deposited and formed (314). P-type dopants can be implanted to form a p-doped p-body (PBODY) region (316). N-type dopants can be implanted to form a lightly doped drain (LDD) region in the source region (318), and a deeper N-LD region in the drain region (320). Then, spacer formation (322), implantation of n-type dopants to form source and drain n-type regions (324), and implantation of p-type dopants to form a p-type region in the source (326) can occur, thus completing the flow (328).

Exemplary Method of Making an LDMOS Transistor

An exemplary method of fabricating an LDMOS transistor with a source region, a drain region, and a gate region on a substrate, can include: (i) implanting n-type dopants into a surface of the substrate to form an n-doped deep n-well (DNW) region; (ii) forming a gate oxide and a drain oxide between the source region and the drain region of the transistor, the gate oxide being adjacent to the source region, the drain oxide being adjacent to the drain region; (iii) forming a gate by covering the gate oxide and a portion of the drain oxide with a conductive material; (iv) implanting p-type dopants into the source region to form a p-doped p-body region; (v) implanting n-type dopants into the drain region to form an n-doped drain region; (vi) implanting n-type dopants into the source region to form a first n-doped n+ region; (vii) implanting n-type dopants into the drain region to form a second n-doped n+ region; and (viii) implanting p-type dopants into the source region to form a p-doped p+ region.

Figure 4:
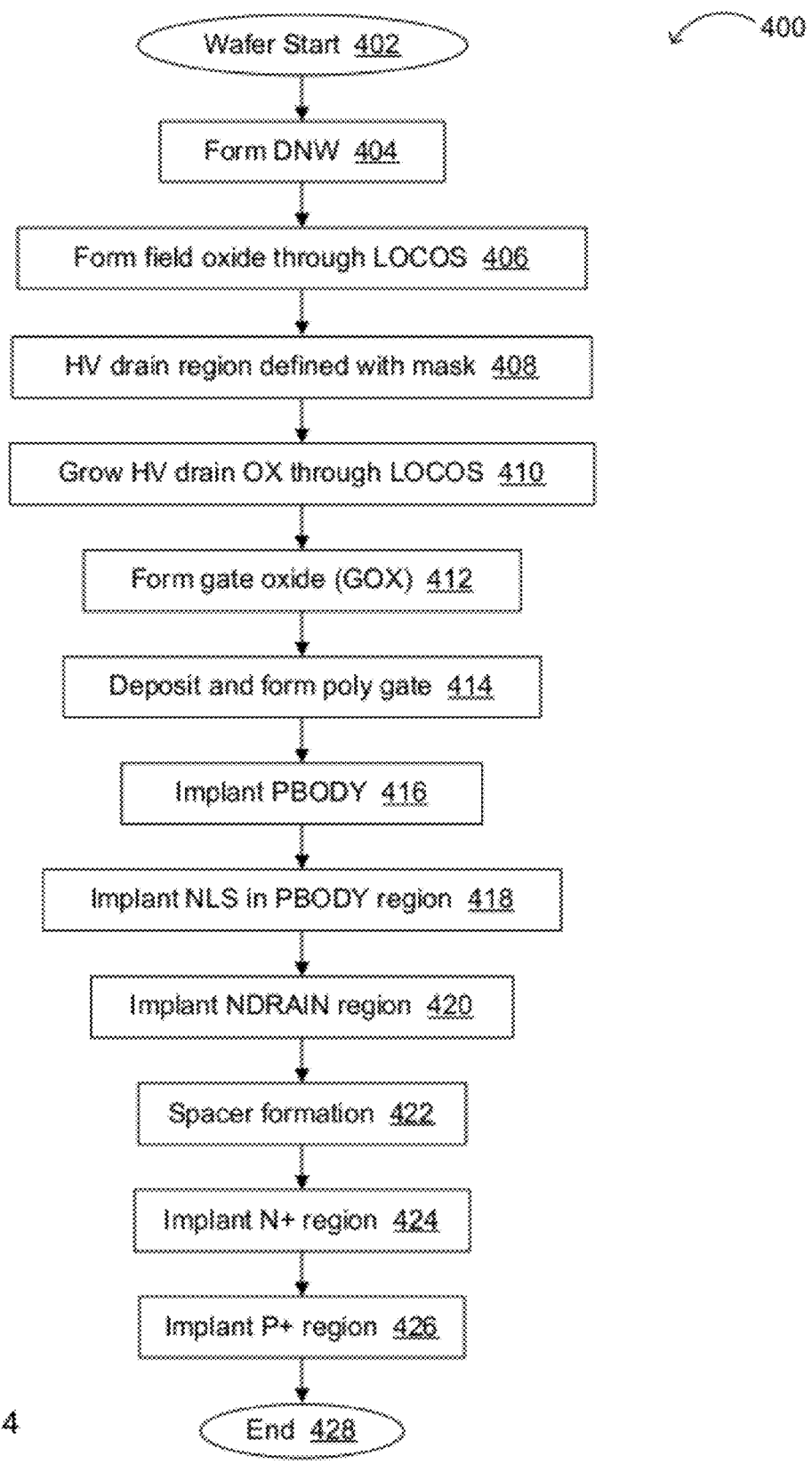
FIG. 4 is a flow diagram of an example method of making an n-type LDMOS transistor in accordance with embodiments of the present invention.

Referring now to FIG. 4, shown is a flow diagram 400 of an example method of making an LDMOS transistor in accordance with embodiments of the present invention. The flow can begin (402), and a deep n-well (DNW) can be formed (404). A FOX region can be formed, such as by using LOCOS (406). A high voltage (HV) drain region can be defined using a mask (408). An HV drain oxide layer can then be grown through LOCOS (410). A gate oxide (GOX) can then be formed (412). A polysilicon gate can be deposited and formed (414). P-type dopants can be implanted to form a p-doped p-body region (416).

P-type dopants can be implanted to form a p-doped p-body region (416), and n-type dopants can be implanted using the same mask to form an n-doped source link (NSL) region (418). Thus, one window opening for the p-body region can be used to include two opposite doping regions (p-type and n-type) in the p-body region. N-type dopants can be implanted to form an n-doped drain region (420), which can also be used for formation of other devices therein. Then, spacer formation (422), implantation of n-type dopants to form source and drain n-type (n+) regions (424), and implantation of p-type dopants to form a p-type (p+) region in the source (426) can occur, thus completing the flow (428).

The ordering of process flow steps as described herein can be suitably altered in particular embodiments. For example, an order of p-doped p-body region and NSL formation with respect to n-doped drain region formation can be reversed. Similarly, formation of source and drain n+/p+ regions can be reversed, or otherwise altered. Further, a similar process flow can be used to form p-type LDMOS transistors, with appropriate doping variations. An example of such a p-type LDMOS transistor structure will be discussed below with reference to FIG. 7.

In particular embodiments, a transistor gate at least partially covers a regular gate oxide plus a drain oxide (e.g., such as formed through LOCOS). While a thickness of a field region (FOX), such as for isolation of the transistor, may be about 4000 Å, the drain oxide may be about 1000 Å. Further, the drain oxide may be grown (e.g., using LOCOS) such that other regions are not substantially affected. This is because LOCOS is selectively defined, as opposed to where oxide is uniformly grown and then partially etched away based on a mask pattern. In addition, a FOX region may also be a first LOCOS, where the LOCOS under the gate (drain oxide) can be a second LOCOS. In this fashion, a special selectivity of the drain oxide can be obtained for improved thickness control, as compared to conventional approaches.

Figure 5A:
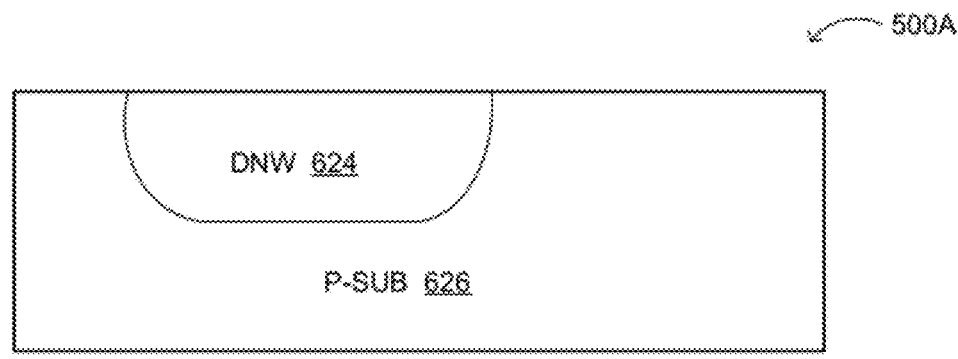
FIGS. 5A-5L are cross-section diagrams showing an example process flow for making an n-type LDMOS transistor in accordance with embodiments of the present invention.
Figure 5B:
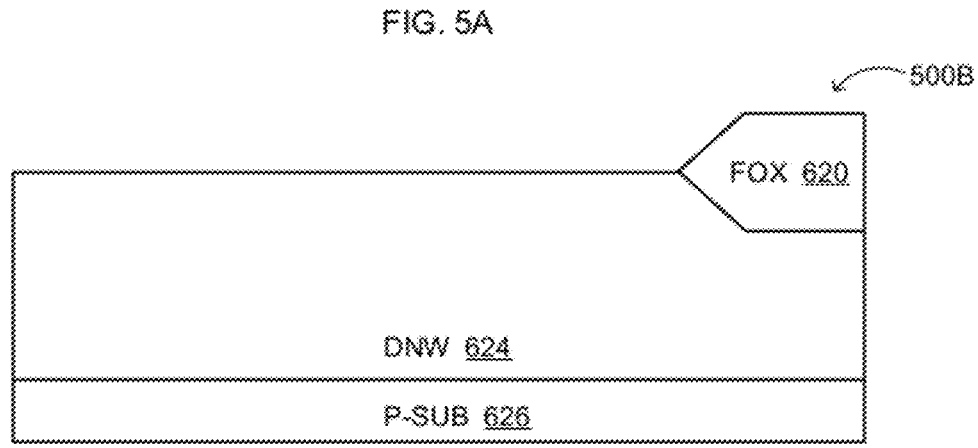

Referring now to FIGS. 5A-5L, shown are cross-section diagrams of an example process flow for making an LDMOS transistor in accordance with embodiments of the present invention. In FIG. 5A (500A), deep n-well (DNW) 624 is formed in p-type substrate 626. In FIG. 5B (500B), field oxide (FOX) region 620 can be formed within DNW 624 through standard LOCOS.

Figure 5C:
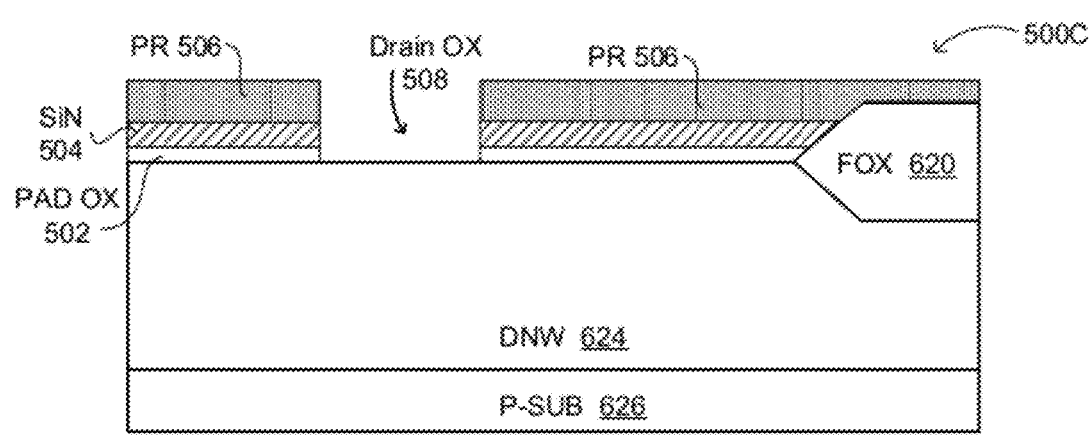
Figure 5D:
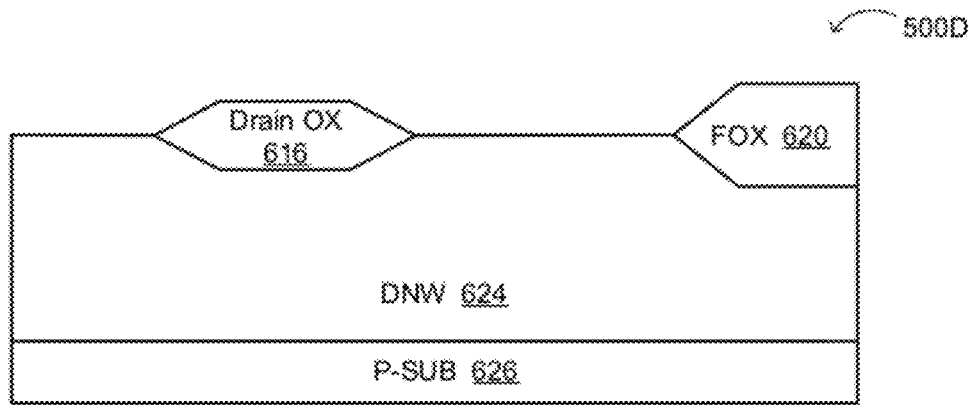

In FIG. 5C (500C), a high-voltage drain region can be defined using a mask. Pad oxide 502 may grow, followed by deposition of nitride protection layer 504. Then, photoresist layer 506 can be deposited. Here, photoresist layer 506 can be patterned, and silicon nitride 504 and pad oxide 502 layers can be etched to reveal a region (508) for formation of a drain oxide. Photoresist can then be removed, and the HV drain oxide can grow locally on designated region 508. After formation of HV drain oxide through LOCOS, nitride 504 and pad oxide 506 may be removed, resulting in example structure shown in FIG. 5D (500D).

Figure 5E:
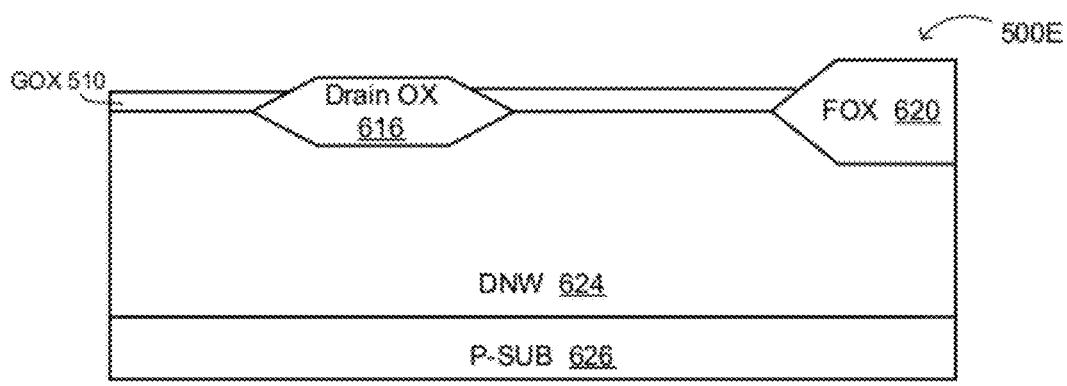
Figure 5F:
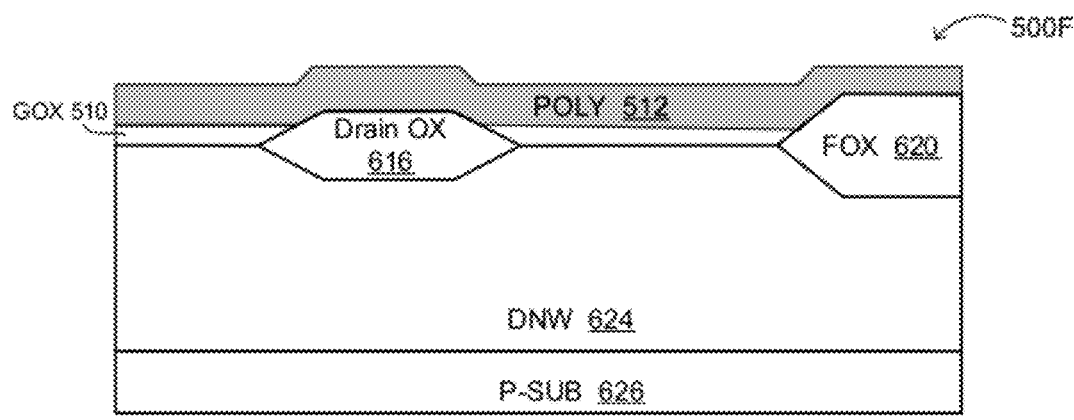
Figure 5G:
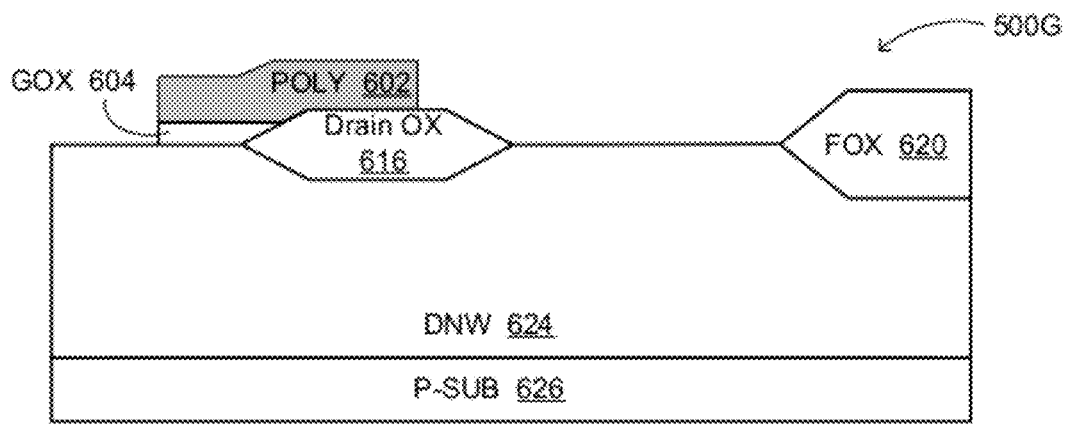

In FIG. 5E (500E), a gate oxide can be formed by growing oxide 510 as shown. In FIG. 5F (500F), polysilicon 512 can be deposited over oxide 510, LOCOS drain oxide 616, and FOX 620. In FIG. 5G (500G), the polysilicon gate can be formed. Etching of polysilicon layer 512 and oxide layer 510 can be done to form a polysilicon gate 602 and gate oxide (GOX) 604.

Figure 5H:
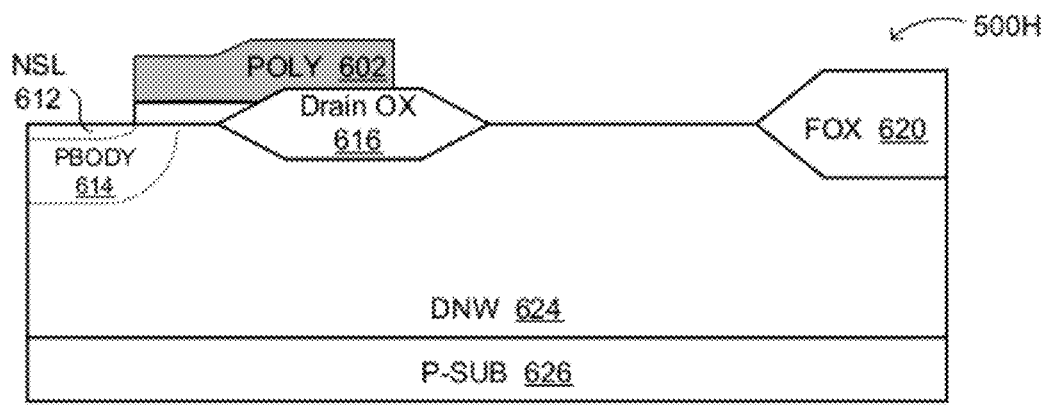
Figure 5I:
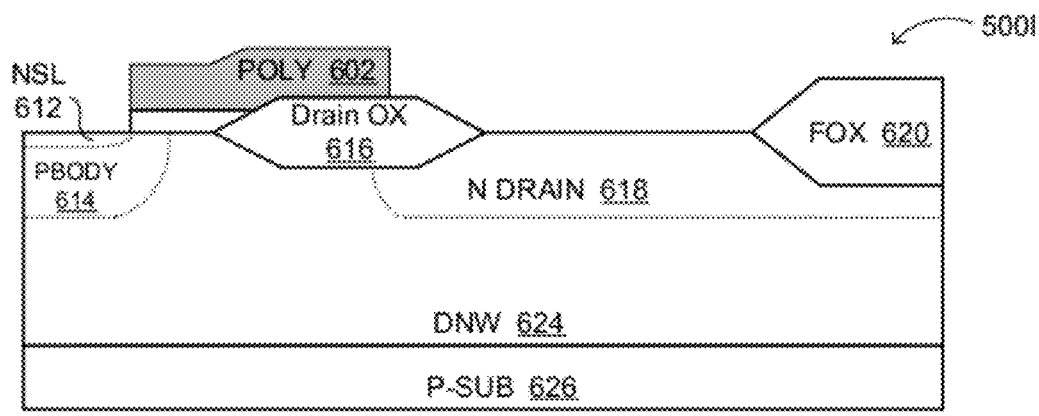
Figure 5J:
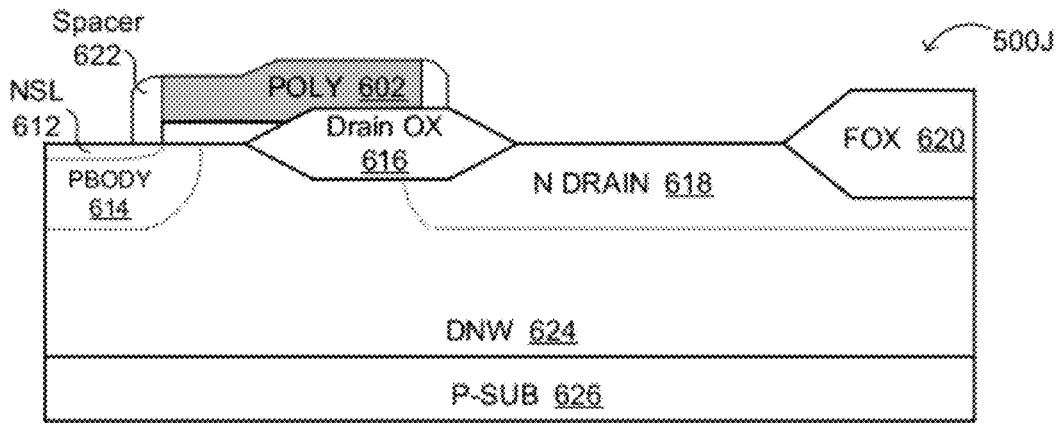

In FIG. 5H (500H), p-type p-body (PBODY) 614 and NSL regions 612 can be implanted. As discussed above, a same mask can be utilized for both implantation of NSL region 612 and PBODY 614. In FIG. 5I (500I), an n-type drain (618) can be implanted. In FIG. 5J (500J), spacers 622 can be formed on either side of polysilicon gate 602.

Figure 5K:
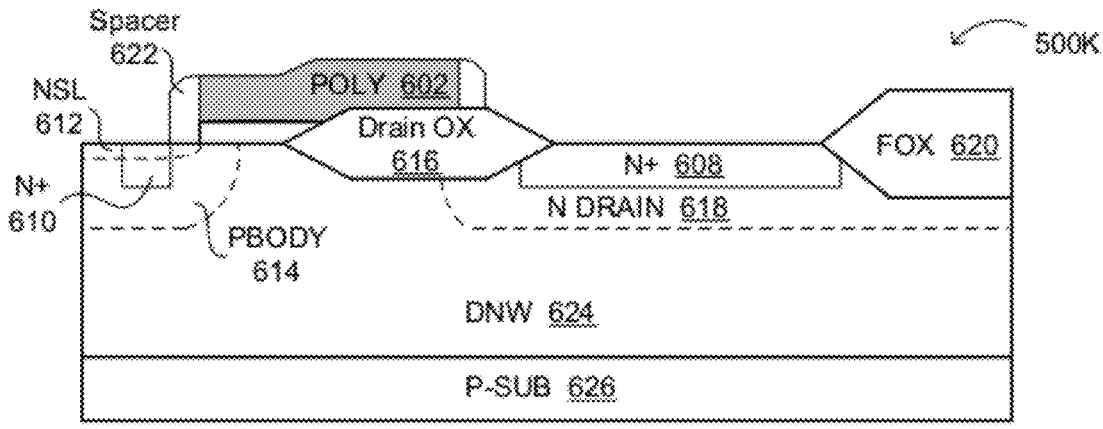
Figure 5L:
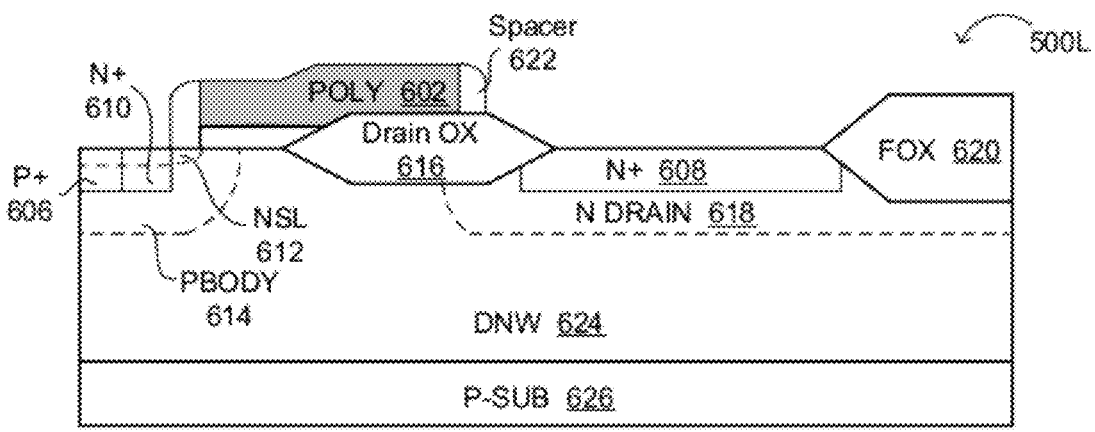

In FIG. 5K (500K), n+ region implantation can be performed by implanting n-type dopants. For example, n+ region 608 can be formed as shown in n-type drain region 618, and n+ region 610 can be formed in p-type p-body region 614. In FIG. 5L (500L), p+ region implantation can be performed by implanting p-type dopants. For example, p+ region 606 can be formed adjacent to n+ region 610 in p-type p-body region 614. The p+ region 606 may compensate the overlapping NSL region region and form a p-type ohmic contact to a subsequently formed source electrode.

Alternatively, formation of the NDRAIN region can be performed prior to gate formation in particular embodiments. The formation of the NDRAIN region can also be skipped in certain embodiments. Likewise, other processing steps can be performed in other sequences. For example, the sequence of the formation of some doped regions, such as n+ and p+, can be reversed, or performed in other positions in the overall process flow.

In addition, while particular process steps or sequences have been shown for formation of LDMOS devices, such process modules may be embedded with other process modules, such as the CMOS or bipolar modules. In such cases, there can be additional processing steps in the process sequence flows described herein. For example, there may be other implantation steps prior to the FOX LOCOS, between the FOX LOCOS and a second HV drain oxide LOCOS, and/or between the second LOCOS and gate oxide formation, etc.

Exemplary N-type LDMOS Transistor Structure

In one example, an LDMOS transistor structure can include: (i) an n-doped deep n-well (DNW) region on a substrate; (ii) a gate oxide and a drain oxide between a source region and a drain region of the LDMOS transistor, the gate oxide being adjacent to the source region, the drain oxide being adjacent to the drain region; (iii) a conductive gate over the gate oxide and a portion of the drain oxide; (iv) a p-doped p-body region in the source region; (v) an n-doped drain region in the drain region; (vi) a first n-doped n+ region and a p-doped p+ region adjacent thereto in the p-doped p-body region of the source region; and (vii) a second n-doped n+ region in the drain region.

Figure 6:
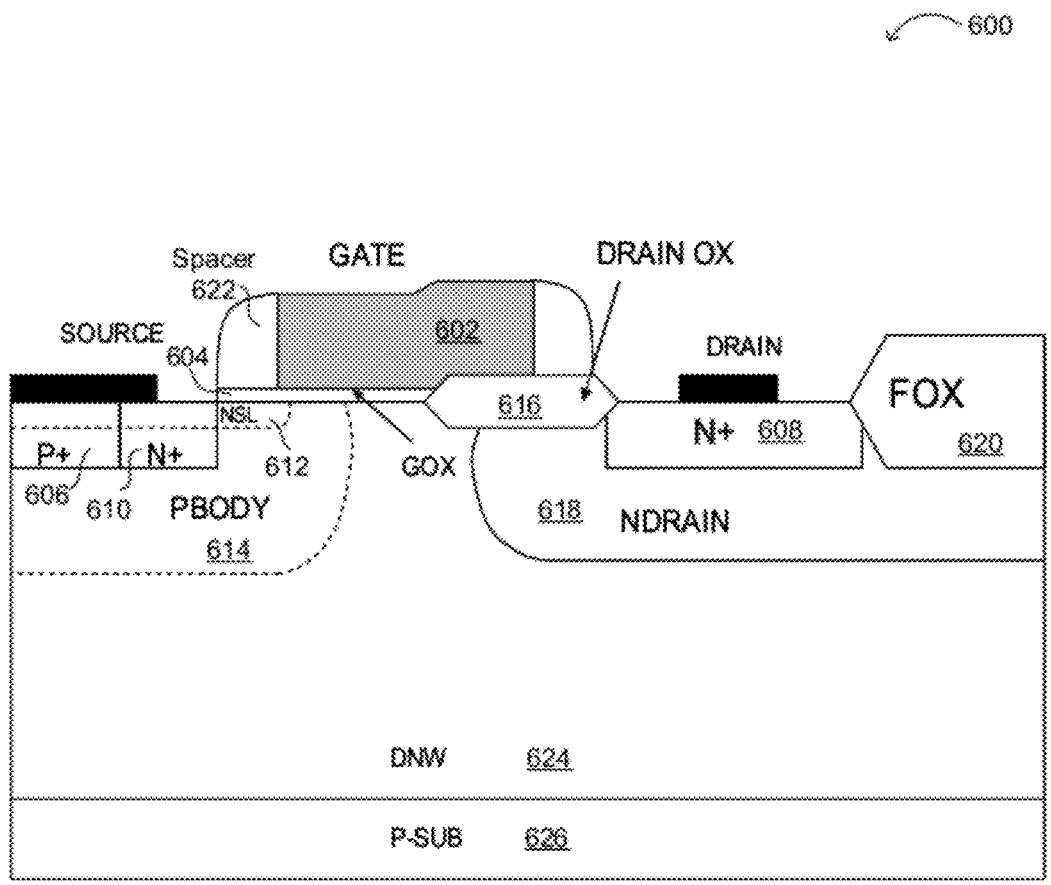
FIG. 6 is a cross-section diagram of an example n-type LDMOS transistor structure in accordance with embodiments of the present invention.

Referring now to FIG. 6, shown is a cross-section diagram 600 of an example n-type LDMOS transistor structure in accordance with embodiments of the present invention. For example, the structure of FIG. 6 can be formed using the process steps shown above with reference to FIGS. 5A-5L, or suitable variations thereof. The active region between source and drain electrodes of this example LDMOS transistor device can include two portions: (i) a regular low-voltage (LV) gate oxide region 604, such as those used for CMOS processes; and (ii) a special high-voltage (HV) drain oxide 616 formed through a LOCOS, which may be different from a convention LOCOS process that is used for FOX isolation regions 620.

The p-body region can include two oppositely doped regions: (i) a p-doped p-body region 614; and (ii) an n-doped source link (NSL) region 612. In this example, the NSL region may cover a width of substantially the body region the p-body region. As a result, the NSL and p-body regions can be implemented using a same mask to reduce costs and simplify the fabrication process. The P-body implant and NSL implant may also be combined into a single chain implantation step with two oppositely doped impurities: one being a p-type impurity and the other being an n-type impurity. The NSL region may also overlap with at least part of both source n+ 610 and p+ 606 regions. This is in contrast to other approaches whereby a lightly doped drain (NLDD) region is used, but the NLDD overlaps only with the n+ region in the drain, and is implemented using a processing step that is separate from the p-body formation step.

A second LOCOS approach for the drain oxide can cover a remaining silicon area with nitride for protection, followed by selective growth of the drain oxide on a designated region. Thus in particular embodiments, this approach can substantially eliminate thinning of isolation FOX regions. Further, control of the oxide thickness for the drain oxide can allow for improved optimization, as compared to conventional approaches. Also, particular embodiments can be utilised to develop such drain oxides of any suitable thickness. For example, drain oxide thicknesses of from about 50 Å to about 2000 Å, including from about 250 Å to about 1500 Å, and more precisely about 1000 Å, can be supported.

In addition, such a second LOCOS approach for drain oxide formation can also eliminate any sharp step transitions between various oxides under transistor gates. This is because the bird beak region resulting from the second LOCOS process provides a substantially smooth transitional between the GOX and drain oxide regions.

Generally, formation of LOCOS drain oxides includes: (i) formation of a protection layer (e.g., pad oxide and silicon nitride); (ii) photolithography for definition of the drain oxide region; (iii) thick oxidation and (iv) formation of LOCOS drain oxide. Steps in HVGOX formation generally include: (i) thick oxidation; (ii) photolithography to define the HVGOX region; and (iii) formation of the HVGOX.

Exemplary P-type and Alternative LDMOS Transistor Structures

In one example, an LDMOS transistor structure can include: (i) an n-doped DNW region on a substrate; (ii) a gate oxide and a drain oxide between a source region and a drain region of the LDMOS transistor, the gate oxide being adjacent to the source region, the drain oxide being adjacent to the drain region; (iii) a conductive gate over the gate oxide and a portion of the drain oxide; (iv) an n-doped n-body region in the source region; (v) a p-doped drain region in the drain region; (vi) a first p-doped p+ region and an n-doped n+ region adjacent thereto in the n-doped n-body region of the source region; and (vii) a second p-doped p+ region in the drain region.

Figure 7:
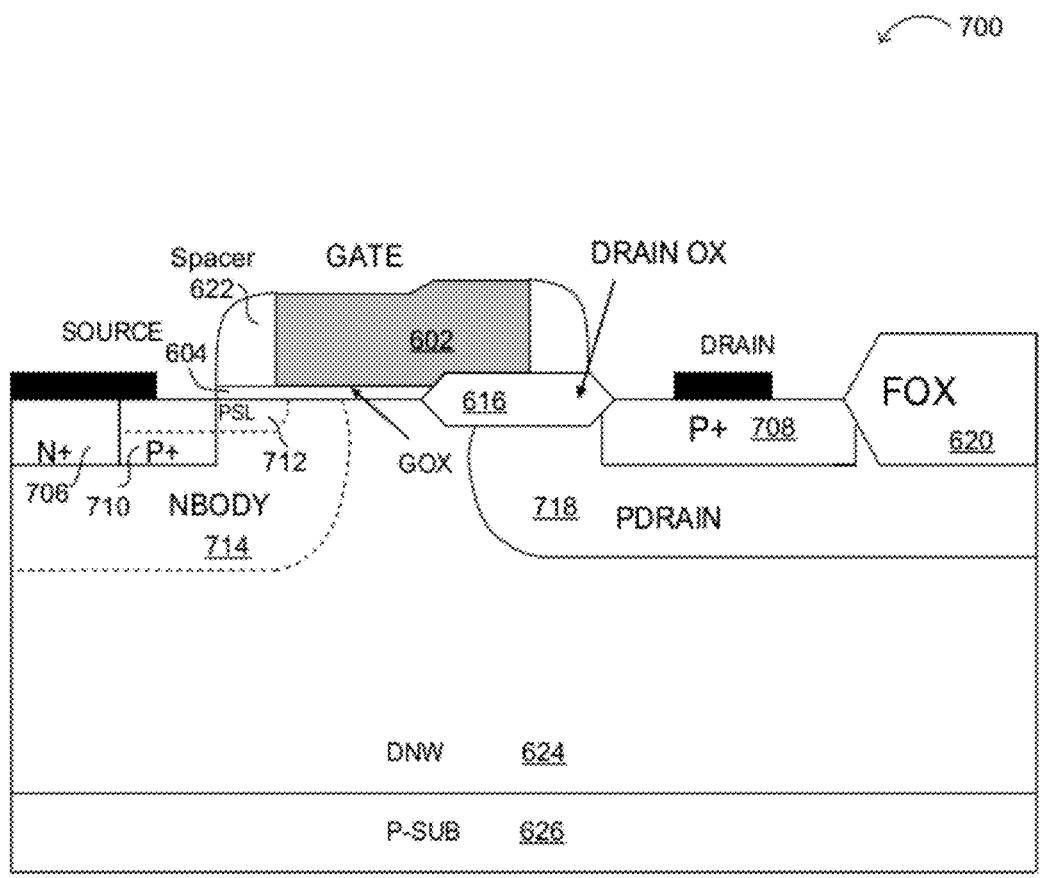
FIG. 7 is a cross-section diagram of an example p-type LDMOS transistor structure in accordance with embodiments of the present invention.

Referring now to FIG. 7, shown is a cross-section diagram 700 of an example p-type LDMOS transistor structure in accordance with embodiments of the present invention. In this particular example, many features, such as the second LOCOS HV drain oxide 616 remain, as in the n-type LDMOS transistor example of FIG. 7. Further, while the p-type LDMOS (e.g., as shown in FIG. 7) is a complementary device structure to the n-type LDMOS transistor (e.g., as shown in FIG. 6), both may be built on a DNW (e.g., 624). Differences include n-type n-body (NBODY) region 714 for control of the channel profile and channel length. In addition, p-type (p+) region 710 is included adjacent to n-type (n+) region 706 in NBODY region 714. Also, a p-doped source link (PSL) region 712 is shown extending out from p-type region 710 in NBODY region 714. On the drain side, p-type drain region 718 is included, with p-type (p+) region 708 therein.

Alternatively, PSL region 712 can span about a width of a n-doped n-body region 714, thus allowing use of a same mask during processing. The n-body implant and PSL implant may also be combined into a single chain implantation step with two oppositely doped impurities: one being an n-type impurity and the other being a p-type impurity. Alternatively, when the p-type LDMOS is built on a DNW, the formation of the NBODY region can be skipped in certain embodiments. The PSL region 712 may have a lower doping than source n+ region 706 such that the n-doped n+ region can compensate the PSL p-doped region 712 and form an n-type ohmic contact from the n-body region to the source electrode (e.g., metal).

Figure 8A:
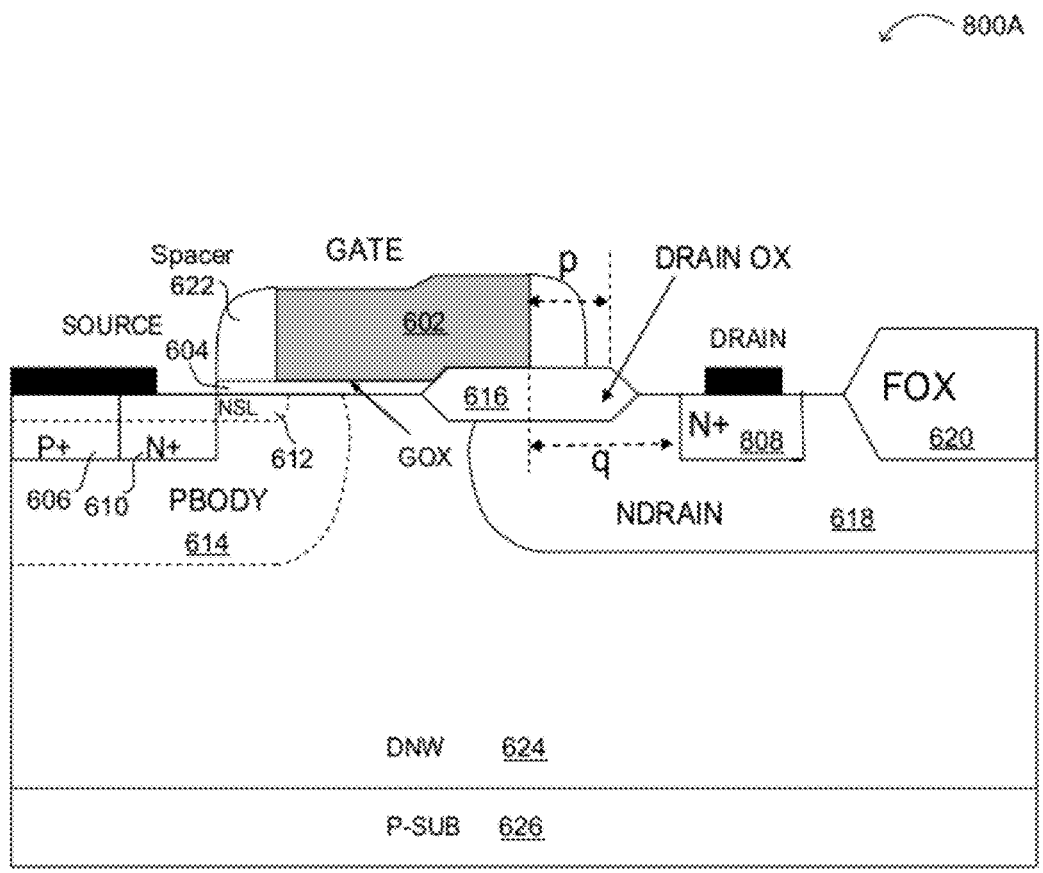
FIG. 8A is a cross-section diagram of an example n-type LDMOS transistor structure where the drain oxide extends a predetermined distance beyond an edge of a poly gate on a drain side, or where there is spacing between the n+ region on the drain region to an edge of the poly gate on the drain side, in accordance with embodiments of the present invention.
Figure 8B:
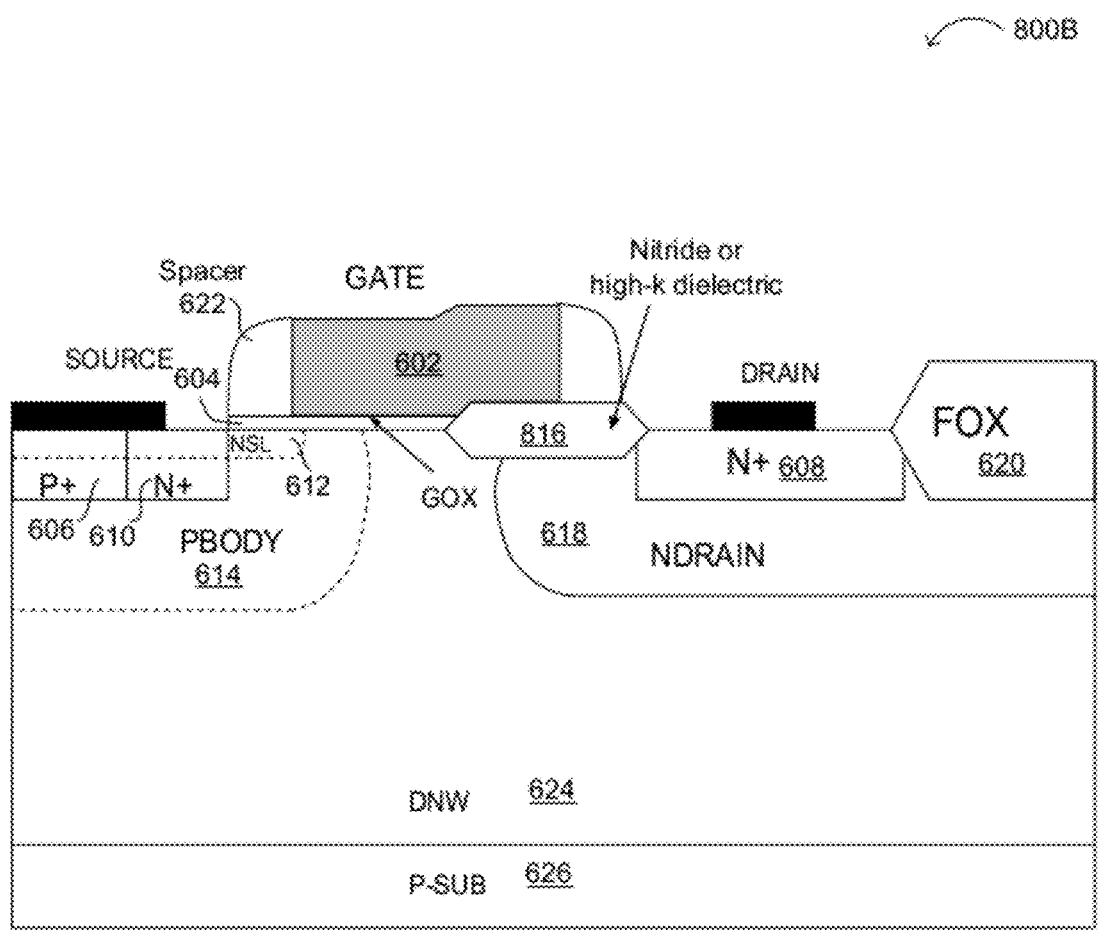
FIG. 8B is a cross-section diagram of an example n-type LDMOS transistor structure using nitride or a high-K dielectric in accordance with embodiments of the present invention.

Referring now to FIG. 8A, shown is a cross-section diagram 800A of an example n-type LDMOS transistor structure in which drain oxide 616 extends a predetermined distance (p) beyond an edge of poly gate 602 on the drain side, or there is a predetermined spacing (q) between the drain n+ region 808 to an edge of poly gate 602 on the drain side, in accordance with embodiments of the present invention. Such a distance (p) can range from about 0.1 µm to about 0.5 µm, including from about 0.15 µm to about 0.25 µm, and more specifically about 0.2 µm. Such a spacing (q) can range from about 0.1 µm to about 0.8 µm, including from about 0.2 µm to about 0.6 µm, and more specifically about 0.4 µm. In FIG. 8B, shown is a cross-section diagram 800B of an example LDMOS transistor structure using a nitride or high-K dielectric 816 in accordance with embodiments of the present invention.

Exemplary LDMOS Transistor Application

Figure 9:
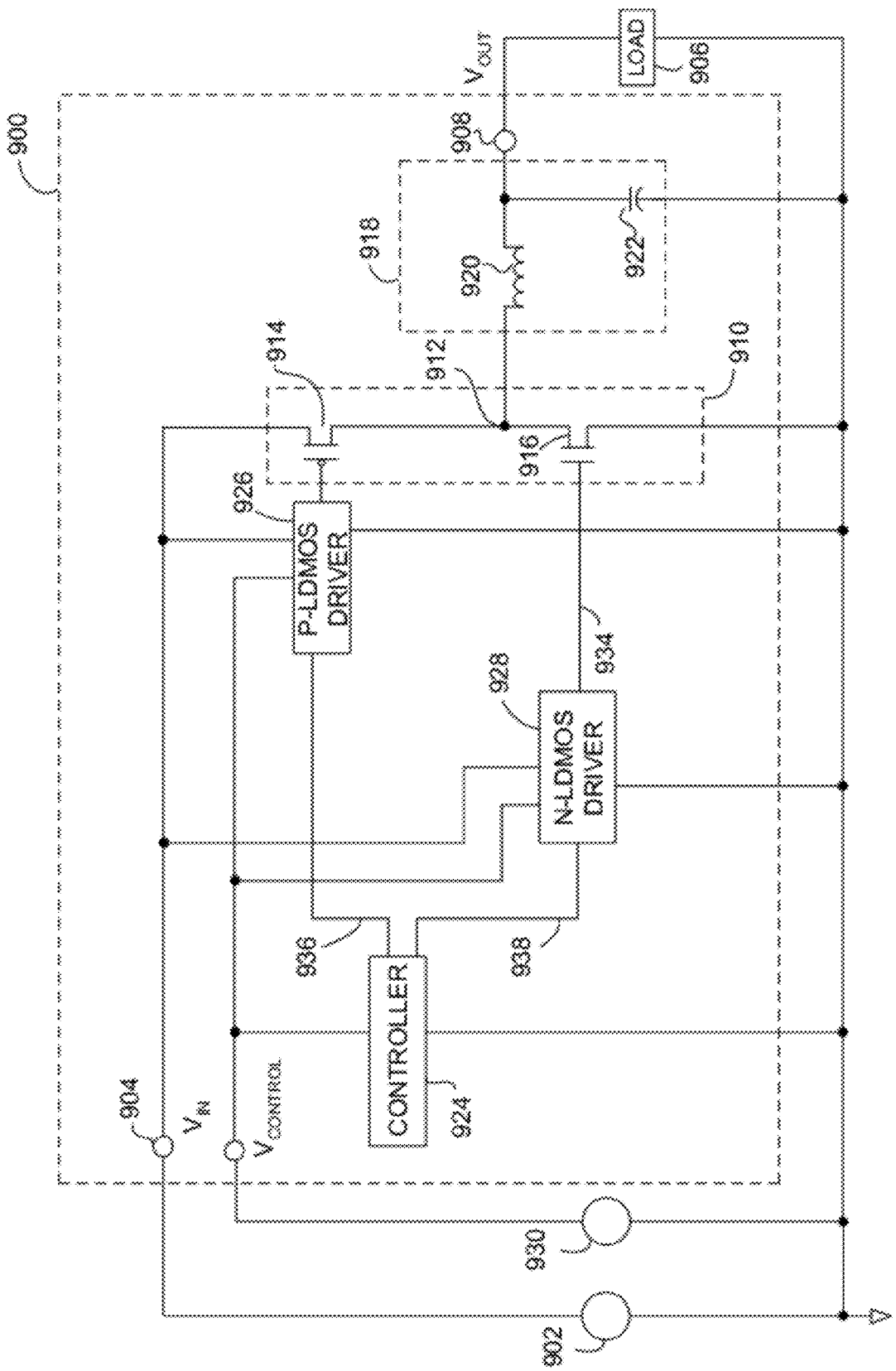
FIG. 9 is a block schematic diagram of an example switching voltage regulator application of LDMOS transistors suitable for use in accordance with embodiments of the present invention.

Referring now to FIG. 9, shown is a block schematic diagram 900 of an example switching voltage regulator application of LDMOS transistors suitable for use in accordance with embodiments of the present invention. Exemplary switching regulator 900 may be coupled to a first high DC input voltage source 902 (e.g., a battery) by an input terminal 904. The switching regulator 900 may also be coupled to a load 906 (e.g., an IC) by an output terminal 908. The switching regulator 900 thus serves as a DC-to-DC converter between the input terminal 904 and the output terminal 908.

The switching regulator 900 can include a switching circuit 910 that serves as a power switch for alternately coupling and decoupling the input terminal 904 to an intermediate terminal 912. Switching circuit 910 may also include a rectifier, such as a switch or diode, coupling the intermediate terminal 912 to ground. For example, switching circuit 910 may include a first transistor 914 having a source connected to the input terminal 904, and a drain connected to the intermediate terminal 912, and a second transistor 916 having a source connected to ground and a drain connected to the intermediate terminal 912. The first transistor 914 may be a p-type LDMOS transistor, whereas the second transistor 916 may be an n-type LDMOS transistor.

The intermediate terminal 912 may be coupled to the output terminal 908 by an output filter 918. The output filter 918 converts the rectangular waveform of the intermediate voltage at the intermediate terminal 912 into a substantially DC output voltage at the output terminal 908. In an example buck-converter topology, output filter 918 includes an inductor 920 connected between intermediate terminal 912 and the output terminal 908, and a capacitor 922 connected in parallel with the load 906. During a p-type LDMOS conduction period, the first transistor is closed, and the voltage source 902 supplies energy to the load 906 and the inductor 920 through the first transistor 914. However, during an LDMOS transistor conduction period, the second transistor 916 is closed, and current flows through the second transistor 916 as energy is supplied by the inductor 920. The resulting output voltage $V_{out}$ is a substantially DC voltage.

The switching regulator may also include a controller 924, a p-type LDMOS driver 926, and an n-type LDMOS driver 928 for controlling the operation of the switching circuit 700. The p-type LDMOS driver 926 and the n-type LDMOS driver are coupled to voltage source 930. A first control line 932 can connect the p-type LDMOS transistor 914 to its driver 926, and a second control line 934 can connect the n-type LDMOS transistor 916 to its driver 928. The two drivers may be connected to the controller 924 by control lines 936 and 938, as shown. The controller 924 causes the switching circuit 900 to alternate between p-type LDMOS and n-type LDMOS conduction periods so as to generate an intermediate voltage $V_{int}$ at intermediate terminal 912 that has a rectangular waveform. Controller 924 can also include a feedback circuit for measuring the output voltage and the current passing through the output terminal.

Although the controller 924 is typically a pulse width modulator, particular embodiments are also applicable to other modulation schemes, such as pulse frequency modulation. Further, while the switching regulator discussed above has a buck converter topology, particular embodiments are also applicable to other voltage regulator topologies, such as a boost converter or a buck-boost converter, and to radio frequency (RF) output amplifiers.

In another application example, an n-type LDMOS, which is also known as high-side switch, can be used to replace p-type LDMOS transistor 914. In this example configuration, the n-type high-side switch may have its drain connected to input terminal 904, and its source connected to intermediate terminal 912. The p-type LDMOS driver 926 may also be replaced with a high-side n-type LDMOS driver in this particular example.

While the above examples include processing and structural implementations of LDMOS transistors, one skilled in the art will recognize that other technologies and/or structures in accordance with embodiments. Further, one skilled in the art will recognize that other device cross-section arrangements and the like may also be used in accordance with embodiments. For example, and as shown above, p-type LDMOS devices as well as n-type LDMOS devices can be formed. Further, spacing between n+ drain regions and the gate can be changed in particular embodiments. In addition, nitride or a high-K dielectric material can be used in place of the drain oxide in particular embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A lateral double-diffused metal oxide semiconductor (LDMOS) transistor, comprising:
   a) an n-doped deep n-well (DNW) region on a substrate;
   b) a field oxide (FOX) for isolation of the LDMOS transistor, wherein the FOX comprises a first local oxidation of silicon (LOCOS);
   c) a gate oxide and a drain oxide between a source region and a drain region of the LDMOS transistor, the gate oxide being adjacent to the source region, the drain oxide being adjacent to the drain region, wherein the drain oxide comprises a second LOCOS that is different than the first LOCOS such that a thickness of the drain oxide is different than a thickness of the FOX;
   d) a conductive gate over the gate oxide and a portion of the drain oxide;
   e) a p-doped p-body region in the source region;
   f) an n-doped drain region in the drain region, the n-doped drain region ending under the drain oxide;
   g) a first n-doped n+ region and a p-doped p+ region adjacent thereto in the p-doped p-body region of the source region; and
   h) a second n-doped n+ region in the drain region.

2. The LDMOS transistor of claim 1, wherein the FOX is positioned adjacent to the drain region.

3. The LDMOS transistor of claim 1, wherein the thickness of the drain oxide is less than the thickness of the FOX.

4. The LDMOS transistor of claim 3, wherein the thickness of the drain oxide is about 1000 Å, and the thickness of the FOX is about 4000 Å.

5. The LDMOS transistor of claim 1, wherein the drain oxide comprises at least one of: nitride and a high-K dielectric material.

6. The LDMOS transistor of claim 1, further comprising an n-doped source link (NSL) region in the p-doped p-body region.

7. The LDMOS transistor of claim 6, wherein the NSL region overlaps at least a portion of the first n-doped n+ region and the p-doped p+ region in the source region.

8. The LDMOS transistor of claim 1, wherein the drain oxide extends a predetermined distance laterally beyond a drain side edge of the conductive gate.

9. The LDMOS transistor of claim 1, wherein a predetermined spacing separates the second n-doped n+ region from a drain side edge of the conductive gate.

10. The LDMOS transistor of claim 1, wherein the DNW region comprises an n-doped epitaxial layer on the substrate, the substrate being a p-doped substrate.

11. A lateral double-diffused metal oxide semiconductor (LDMOS) transistor, comprising:
   a) an n-doped deep n-well (DNW) region on a substrate;
   b) a field oxide (FOX) for isolation of the LDMOS transistor, wherein the FOX comprises a first local oxidation of silicon (LOCOS);
   c) a gate oxide and a drain oxide between a source region and a drain region of the LDMOS transistor, the gate oxide being adjacent to the source region, the drain oxide being adjacent to the drain region, wherein the drain oxide comprises a second LOCOS that is different than the first LOCOS such that a thickness of the drain oxide is different than a thickness of the FOX;
   d) a conductive gate over the gate oxide and a portion of the drain oxide;
   e) an n-doped n-body region in the source region;
   f) a p-doped drain region in the drain region, the p-doped drain region ending under the drain oxide;
   g) a first p-doped p+ region and an n-doped n+ region adjacent thereto in the n-doped n-body region of the source region; and
   h) a second p-doped p+ region in the drain region.

12. The LDMOS transistor of claim 11, further comprising a p-doped source link (PSL) region in the n-doped n-body region, wherein the PSL region overlaps at least a portion of the first p-doped p+ region and the n-doped n+ region in the source region.

13. The LDMOS transistor of claim 12, wherein the n-doped n-body region and the PSL region are implanted using a same mask.

14. The LDMOS transistor of claim 11, wherein the FOX is positioned adjacent to the drain region.

15. The LDMOS transistor of claim 11, wherein the thickness of the drain oxide is less than the thickness of the FOX.

16. The LDMOS transistor of claim 15, wherein the thickness of the drain oxide is about 1000 Å, and the thickness of the FOX is about 4000 Å.

17. The LDMOS transistor of claim 11, wherein the drain oxide comprises at least one of: nitride and a high-K dielectric material.

18. The LDMOS transistor of claim 11, wherein the drain oxide extends a predetermined distance laterally beyond a drain side edge of the conductive gate.

19. The LDMOS transistor of claim 11, wherein a predetermined spacing separates the second p-doped p+ region from a drain side edge of the conductive gate.

20. The LDMOS transistor of claim 11, wherein the DNW region comprises an n-doped epitaxial layer on the substrate, the substrate being a p-doped substrate.

* * * * *